United States Patent
Lee et al.

(10) Patent No.: US 6,747,357 B2
(45) Date of Patent: Jun. 8, 2004

(54) DIELECTRIC DEVICE HAVING MULTI-LAYER OXIDE ARTIFICIAL LATTICE WITH LATTICE DIRECTIONAL FEATURE

(75) Inventors: Jaichan Lee, Seoul (KR); Juho Kim, Seoul (KR); Leejun Kim, Seoul (KR); Young Sung Kim, Seoul (KR)

(73) Assignee: Sungkyunkwan University, Suwon-Si (KR)

( * ) Notice: Subject to any disclaimer, the term of this patent is extended or adjusted under 35 U.S.C. 154(b) by 0 days.

(21) Appl. No.: 10/135,764

(22) Filed: May 1, 2002

(65) Prior Publication Data

US 2003/0160329 A1 Aug. 28, 2003

(30) Foreign Application Priority Data

Feb. 23, 2002 (KR) .......................................... 2002-9767

(51) Int. Cl.[7] .......................... H01L 23/48; C30B 23/08; C30B 29/22; H01B 12/00
(52) U.S. Cl. ........................ 257/760; 257/758; 257/759; 257/700; 257/701; 257/15; 257/18; 257/20; 257/22; 257/27; 257/750; 257/753
(58) Field of Search ................................ 257/760, 758, 257/759, 700, 701, 750–753, 728, 725, 724, 15, 18, 22, 20, 27, 9

(56) References Cited

U.S. PATENT DOCUMENTS

| | | | | |
|---|---|---|---|---|
| 6,069,820 A | * | 5/2000 | Inomata et al. | 365/171 |
| 6,100,578 A | * | 8/2000 | Suzuki | 257/627 |
| 6,151,240 A | * | 11/2000 | Suzuki | 365/145 |
| 6,265,019 B1 | * | 7/2001 | Bianconi | 427/62 |
| 6,436,526 B1 | * | 8/2002 | Odagawa et al. | 428/332 |
| 2002/0074544 A1 | * | 6/2002 | Sung et al. | 257/31 |
| 2002/0122959 A1 | * | 9/2002 | Matsunuma et al. | 428/594 TS |

FOREIGN PATENT DOCUMENTS

JP 1-133997 * 5/1989

OTHER PUBLICATIONS

E. D. Specht et al., "X–Ray Diffraction Measurement of the Effect of Layer Thickness on the Ferroelectric Transition in Epitaxial $KTaO_3/KNbO_3$ Multilayers", *Physical Review Letters*, May 11, 1998, pp. 4317–4320, vol. 80, No. 19, The American Physical Society.

M. Hong et al., "Epitaxial Cubic Gadolinium Oxide As A Dielectric For Gallium Arsenide Passivation", *Science*, Mar. 19, 1999, pp. 1897–1900, vol. 283.

(List continued on next page.)

*Primary Examiner*—Alexander Oscar Williams
(74) *Attorney, Agent, or Firm*—Burns, Doane, Swecker & Mathis, L.L.P.

(57) ABSTRACT

A dielectric device has a multi-layer oxide artificial lattice. The artificial lattice is a stacked structure with a plurality of dielectrics. The dielectric film is deposited at a single atomic layer thickness or at a unit lattice thickness. The dielectric film is formed by repeatedly depositing with layer-by-layer growth process at least two dielectric materials having dielectric constant different from each other at least one time in a range of the single atomic layer thickness to 20 nm or by depositing at least two dielectric materials in a predetermined alignment adapted for a functional device, thereby forming one artificial lattice having an identical directional feature. By utilizing the stress applied to an interfacial surface of the consisting layers in the artificial oxide lattice, the dielectric constant and tunability are greatly improved, so the artificial lattice can be adapted for high-speed switching and high-density semiconductor devices and high-frequency response telecommunication devices. In addition, the size of devices can be compacted and a low voltage drive can be achieved.

10 Claims, 13 Drawing Sheets

OTHER PUBLICATIONS

Kenji Ueda et al., "Ferromagnetism in LaFeO$_3$–LaCrO$_3$ Superlattices", *Science*, May 15, 1998, pp. 1064–1066, vol. 280.

Hitoshi Tabata et al., "Formation of Artificial BaTiO$_3$/SrTiO$_3$ Supperlattices Using Pulsed Laser Deposition and Their Dielectric Properties", *Applied Physics Letters*, Oct. 10, 1994, pp. 1970–1972, American Institute of Physics.

Jaemo IM et al., "Composition–Control of Magnetron–Sputter–Deposited (Ba$_x$Sr$_{1-x}$)Ti$_{1-y}$O$_{3+z}$ Thin Films for Voltage Turnable Devices", *Applied Physics Letters*, Jan. 31, 2000, pp. 625–627, vol. 76, No. 5, American Institute of Physics.

S. Hyun et al., "Effects of Strain on the Dielectric Properties of Tunable Dielectric SrTiO$_3$ Thin Films", *Applied Physics Letters*, Jul. 9, 2001, pp. 254–256, vol. 79, No. 2, American Institute of Physics.

* cited by examiner (Ba,Sr)TiO₃

DIELECTRIC DEVICE HAVING MULTI-LAYER OXIDE ARTIFICIAL LATTICE WITH LATTICE DIRECTIONAL FEATURE

This application claims priority under 35 U.S.C. §§ 119 and/or 365 to Application No 2002-9767 filed in Korea on Feb. 23, 2002; the entire content of which is hereby incorporated by reference.

BACKGROUND OF THE INVENTION

1. Field of the Invention

The present invention relates to a dielectric device having a multi-layer oxide artificial lattice and a method for fabricating the same, and more particularly to a dielectric device having a multi-layer oxide artificial lattice formed by depositing atomic unit layers or unit lattice layers having a specific alignment so as to improve tunability of a microwave voltage tunable device and dielectric constant of a capacitor for memory and a gate oxide for MOS devices, and a method for fabricating the same.

2. Description of the Related Art

Recently, semiconductor technologies, which are representative technology of late twenty century, make great stride so that the semiconductor technologies become a symbolic meaning of a development of scientific technique. The high speed and large capacitance of semiconductor devices with regard to a CPU and a memory thereof are rapidly achieved. The semiconductor memory is highly integrated above 1 Giga byte (GB) and a high-speed DRAM capable of inputting/outputting data at a high speed of few nano seconds is suggested (Hitachi, Ltd., (TSE:6501) and Elpida Memory, Inc., Japan, Sep., 26, 2001/Kang, tae won, physics and high technology 9 (7/8), 33 (2000)). In order to achieve the high speed and large capacitance of the semiconductor device required for recent information telecommunication society in which large amount of information is communicated, studies regarding to new semiconductor processes and material have been carried out. The studying object is metal oxide. Metal oxide has various crystal structures, so it has various physical features. Accordingly, metal oxide can provide various functions, which cannot be achieved from conventional semiconductor materials and insulation materials. That is, due to its high dielectric constant, metal oxide is widely utilized in a large scaled integration memory, a non-volatile memory, a microwave dielectric for mobile telecommunication part, a high-temperature superconductor, a sensor using a magnetoresistance effect, and an electrode of semiconductor/electronic devices using the conductivity, so it is recently called as "oxide electronic engineering" (P. A. Cox, Transition Metal Oxide (Clarendon, Oxford, 1992)).

The development of oxide materials having the high dielectric constant is a main point for the large scaled integration, so the study thereof has been actively carried out. In the future capacitor industry, the next-generation materials having an effective equivalent thickness below 1 nm is required, and a gate insulation film of CMOS (gate size 70 nm grade) also requires the effective equivalent thickness below 1 nm. Among oxide dielectrics, ferroelectric oxide has relatively high dielectric constant, so it is spotlighted and studied in the world as materials for achieving the large scaled integration above Giga grade in DRAM (R. A. Mckee et al., Phys. Rev. Lett. 81, 3014 (1998)/D. E. Kotech, Integr. Ferroelectrics, 16, 1 (1997)). In addition, in order to achieve the large scaled integration and high-speed of CMOS, which is a base structure of a semiconductor, the thickness of a gate insulation film is required to be set below 2 nm. However, as the thickness of the insulation film becomes thin, the quantum effect, such as tunneling effect of electrons, occurs. In order to solve the above problem, ferroelectric materials having the high dielectric constant was recently used as the gate insulation film. Among oxides having the high dielectric constant, oxide having peroveskite structure has been spotlighted. Peroveskite oxide has various physical properties, such as the high dielectric constant, ferroelectric, piezoelectric, and electro-optical properties, so it is widely utilized in non-volatile semiconductor memories, piezoelectric devices, optical telecommunication devices, and superconductive devices, and studies utilizing the peroveskite oxide in the devices has been widely carried out (M. Hong et al., Science, 1897 (1999)). The peroveskite oxide has a simple structure of $ABO_3$ and mainly forms a cubic structure, so the physical properties thereof are easily understood so that it is utilized in various applications. For example, $BaTiO_3$, $SrTiO_3$, $(Ba, Sr)TiO_3$, and $(Pb, Zr)TiO_3$ are used as the peroveskite oxide. However, various electronic and optical devices using the ferroelectrics adopt the above materials existing in nature. Accordingly, the critical phenomenon, which is a basic limit of the ferroelectrics, cannot be overcome. That is, the high-integration and large scaled integration of devices and the nano-scale of materials are limited so that a highly-functional nano device cannot be obtained. To achieve the nano device, besides a conventional material to be used, a dielectric artificial material is required (K. Ueda, H. Tabata and T. Kawai, Science 280, 1064 (1998)). The manufacturing of an oxide artificial lattice is recently studied for obtaining a new superconductive material or a ferromagnetic spin alignment, which cannot be obtained from nature. Accordingly, the oxide artificial lattice becomes a new advanced material allowing the nano-scaled thin film growing technology and materials design (H. Tabata, Tanaka and T. Kawai, Appl. Phys. Lett. 65, 1970 (1994)/E. D. Specht et al., Phys. Rev. Lett. 80, 4317 (1998)).

On the other hand, the recently used telecommunication device, that is a microwave voltage tunable device such as a phase shifter, a tunable filter, and a steerable antenna, requires a high tunability. In case of a conventional microwave voltage tunable device, $(Ba, Sr)TiO_3$ is used as an insulation film formed between metal electrodes, so that a metal-insulator-metal structure is achieved. Then, an electric field of 1 MV/cm is applied to the metal electrodes, and about 74% of the tunability is obtained therefrom ("Composition-control of magnetron-sputter-deposited (BaxSr1-x)Ti1+yO3+Z thin films for voltage tunable device", J. Im et al. Appl. Phys. Lett. 76. 625). In addition, when a meta-insulator-metal structure is formed by using $SrTiO_3$ thin films, which is an insulation film formed between metal electrodes, about 55% of the tunability is obtained from the electric filed of 1 MV/cm applied to the metal electrodes ("Effects of strain on the dielectric properties of tunable dielectric. $SrTiO_3$ thin films", S. Hyun and K. Char, Appl. Phys. Lett. 79, 254).

SUMMARY OF THE INVENTION

It is an object of the present invention to manufacture a nano-scaled dielectric (may be semi-stable phase), which does not exist in nature, by forming a dielectric in nano-scale through performing deposition process of an oxide artificial lattice consisting of various atomic stacking sequence with layer-by-layer growth process to overcome the limit of materials existing in nature by growing the artificial material, thereby providing high dielectric constant to a capacitor of tera-level semiconductor memory and a gate oxide of MOS based devices, and also providing high voltage tunability to microwave tunable (or frequency agile) devices.

To achieve the above object, the present invention provides dielectric devices including a multi-layer oxide artificial lattice having a high tunability and dielectric constant and a method for manufacturing the same, wherein an oxide thin film used ma microwave voltage tunable device, dynamic random-access memory (DRAM) OR metal-oxide-semiconductor (MOS) based devices is replaced with the artificial lattice, in which dielectric materials such as $BaTiO_3$ (abbreviated herein as BTO) or $SrTiO_3$ (abbreviated herein as STO) are periodically deposited and grown, thereby compacting the size of the microwave voltage tunable device or memory, and matching with the high speed and high-frequency requirements. When the artificial lattice is formed by forcibly growing the BTO or SSTO atomic layer with layer-by-layer growth, the high voltage tunability $(=(C_{max}-C_{min}/C_{min}))$ and high dielectric constant are represented due to the stress applied to an interfacial surface between BTO and STO. Even when the thickness of the thin film is reduced, the property of the oxide artificial lattice can be utilized as a capacitor of the microwave voltage tunable device and a capacitor of memory devices and gate oxide in MOS based devices.

To achieve this and other objects, the present invention provides a method adapted for a dielectric device having a substrate, a dielectric film coated on the substrate so as to be selectively patterned thereon, and an upper electrode deposited and patterned on the dielectric film, or a dielectric device having a substrate, a lower electrode deposited on the substrate so as to be patterned thereon, a dielectric film coated on an upper portion of the lower electrode so as to be selectively patterned thereon, and an upper electrode deposited and patterned on the dielectric film. The dielectric films are constructed by depositing sequentially each consisting layers with one unit lattice thickness (~0.4 nm) (so called layer-by-layer growth process). The dielectric film is formed by repeatedly depositing at least two dielectric materials having dielectric constant different from each other at least one time in a range of the unit lattice thickness (~0.4 nm) to 20 nm or by depositing at least two dielectric materials in a predetermined alignment adapted for a functional device, thereby forming one artificial lattice having an identical directional feature.

At this time, the dielectric material to be used is capable of periodically depositing the atomic unit layers including perovskite, tungsten bronze, and pyro-clore structures. Preferably, the dielectric material is any one selected from the group consisting of $BaTiO_3$, $SrTiO_3$, $KNbO_3$, $KTaO_3$, $PbTiO_3$, $PbZrO_3$, and $CaTiO_3$ having a peroveskite structure. More preferably the dielectric material is one of $BaTiO_3$ and $SrTiO_3$ having a peroveskite structure. At this time, a lattice of $BaTiO_3$ is preferably transformed in a c-axis direction within a range of $1.01 \leq c/a \leq 1.05$, and a lattice of $SrTiO_3$ is preferably transformed in an a-axis direction within a range of $0.08 \leq c/a \leq 1.0$.

In addition, the substrate and the dielectric film have crystal structures having directional features identical to each other. The dielectric film can be utilized as a capacitor of memory devices, a gate oxide of MOS based devices, and a capacitor of the microwave voltage tunable device of which the dielectric constant is varied according to the voltage applied thereto.

On the other hand, according to a method for manufacturing the dielectric device having a multi-layer oxide artificial lattice, the dielectric film is constructed by depositing sequentially each consisting layers with one unit lattice thickness (~0.4 nm) and is formed by repeatedly depositing at least two dielectric materials having dielectric constant different from each other at least one time within a critical thickness in the repeating period range, capable of maintaining a lattice coherence or a partial coherence, or depositing at least two dielectric materials in a predetermined alignment adapted for a functional device, thereby forming one artificial lattice having an identical directional feature.

At this time, the repeating period of the dielectric material is preferably determined within a range of 0.8 to 20 nm. In addition, the manufacturing process of the dielectric film is any one selected from the group consisting of a pulsed laser deposition process, a molecule beam epitaxial process, a chemical vapor deposition process, a physical vapor deposition process, an atomic layer deposition process and a sputtering process. In detail, the pulsed laser deposition process comprises the steps of setting a deposition temperature in a range of 600 to 700° C. while raising the deposition temperature by 10° C. per minute and maintaining a partial pressure of oxygen in a predetermined range of 1 mTorr to 300 mTorr, thereby forming a process atmosphere; rotating the substrate at a predetermined speed within a range of 8 to 12 rpm; focusing a laser having 248 nm of wavelength and 30 ns of pulse in a size of 8×2 mm with using KrF gas as a laser source, and inputting targets of $BaTiO_3$ and $SrTiO_3$ having 99.9% purity into the substrate with setting a power intensity of the laser in a range of 1 to 3 $J/cm^2$; performing the deposition process by radiating the laser to the targets at a rate of 1 pulse/sec with setting a deposition speed of the $BaTiO_3$ and $SrTiO_3$ layers in a range of 9 to 13 pulse/1 unit lattice and 11 to 15 pulse/1 unit lattice, respectively; and lowering the temperature of a chamber by 8 to 12° C. per a minute while maintaining the partial pressure of oxygen in the chamber at 300 to 500 Torr, after forming the artificial lattice by using $BaTiO_3$ and $SrTiO_3$.

BRIEF DESCRIPTION OF THE DRAWINGS

The above object, and other features and advantages of the present invention will become more apparent by describing preferred embodiments thereof with reference to the attached drawings in which.

DETAILED DESCRIPTION OF THE PREFERRED EMBODIMENTS

Hereinafter, the preferred embodiment of the present invention will be described with reference to accompanying drawings.

Figure 1:
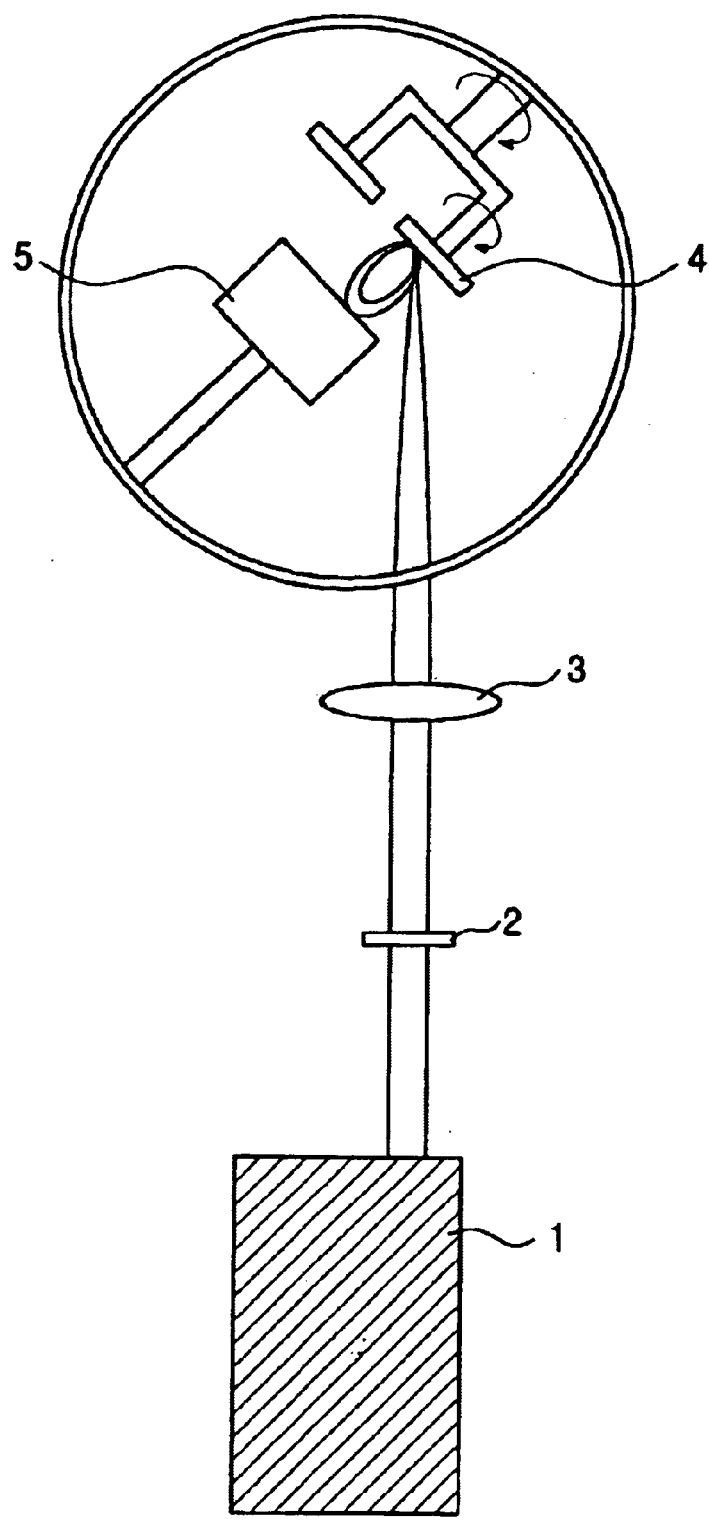
FIG. 1 is a schematic view of a PLD system used for forming a multi-layer oxide artificial lattice according to one embodiment of the present invention.

FIG. 1 is a schematic view of a PLD system used for forming a multi-layer oxide artificial lattice according to one embodiment of the present invention. Referring to FIG. 1, reference numbers 1, 2, 3, 4 and 5 respectively represent an excimer laser, an attenuator, a focusing lens, a target substrate formed with a bottom electrode, and a heater. KrF gas is used as a laser source and the excimer laser 1 is a COMPEX 205 excimer laser available from Lambda Physics Company which has a wavelength of 248 nm and generates 30 ns of pulse. $BaTiO_3$ and $SrTiO_3$ targets having 99.9% of purity are used as the target. The attenuator 2 includes silica glass for controlling the laser energy. Then, the focusing lens 3 is adjusted such that the laser incident into a vacuum chamber has a size of 8×2 mm at the target substrate. The power density of the laser is determined as 2 J/cm$^2$.

The pulsed laser deposition (hereinafter, simply referred to PLD) method will be simply described below. The PLD method is a kind of thermal plasma deposition method, which can obtain a relatively large energy per a unit area by focusing the pulse generated from the laser through an optical lens. If the focusing laser pulse incident into the vacuum chamber is applied to the target having a predetermined chemical composition, materials consisting the target absorb the laser beam, so a thermal evaporation is momentarily generated while creating the plasma. The film is deposited by using the created plasma. Generally, the generated laser has a short time pulse within tens of nano seconds (ns). The target is subject to a thermal circulation for one pulse period, that is the target is heated and cooled during one pulse period is carried out. Elements consisting the target are evaporated while the thermal circulation is carried out, so that the thin film can be deposited. The pulsed laser deposition method can deposit the film regardless of the sort (active gas or inert gas) of gas to be used in the vacuum deposition process while creating a lot of atoms within a short time period. In addition, though the target has various compositions, it is possible to deposit the film having the composition identical to the composition of the target. In case of material having a high melting point, if the material itself can strongly absorb the laser, the deposition of film is possible. In addition, it is not required to add ions during the deposition process, and a heater for heating the material and a device for charging the plasma are not required, so the film can be deposited even in a high-pressure condition. On the contrary, since relatively large particles are generated from the target while the deposition process is being carried out, the surface of the film becomes rough, so the uniformity is lowered when the film is deposited, so that the uniform deposition area is relatively reduced. Examples of parameters affecting the deposition of-film are the temperature of the substrate, power of the laser, wavelength of the laser, pulse period of the laser, partial pressure of gas and a distance between the substrate and target. In the present embodiment, though the dielectric material is deposited by using the pulsed laser deposition process, it is also possible to deposit the dielectric material by using any one selected from the group consisting of a molecule beam epitaxial process, a chemical vapor deposition process, and a physical vapor deposition process.

Figure 2A:
FIGS. 2a to 2d are sectional views showing process steps for manufacturing the multi-layer oxide artificial lattice according to one embodiment of the present invention.
Figure 2B:
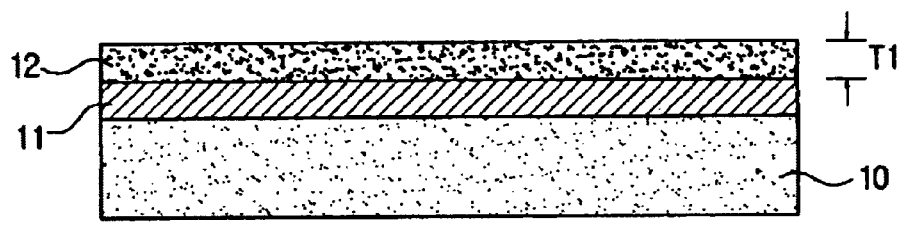
Figure 2C:
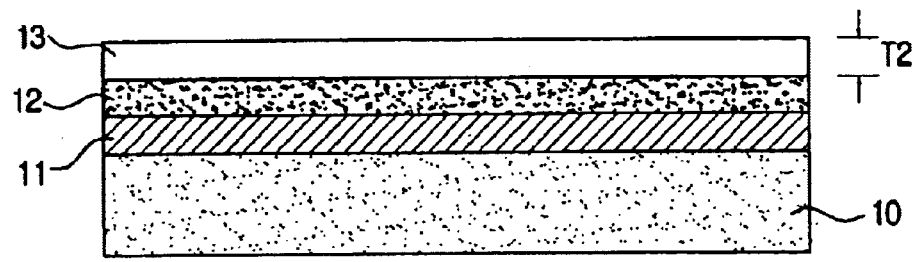
Figure 2D:
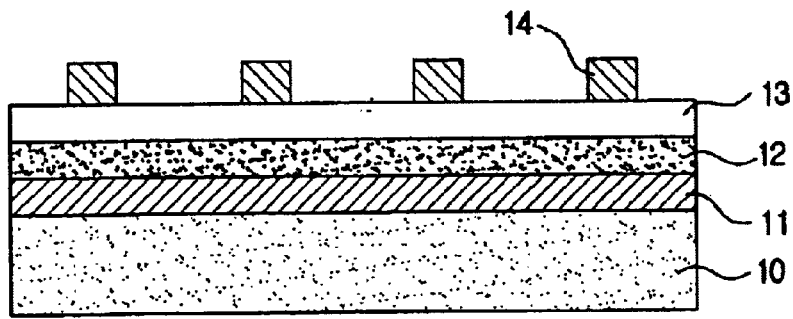

FIGS. 2a and 2d are sectional views showing process steps for manufacturing the multi-layer oxide artificial lattice according to one embodiment of the present invention. Referring to FIG. 2a, by using acetone, methanol and tetraethyl chloride (TEC), an MgO substrate 10 is subject to an ultrasonic cleaning process for 5 minutes, respectively, and dried by using nitrogen. Then, the MgO substrate 10 is attached to a heater by means of silver paster, so that the MgO substrate 10 is dried. After that, by using the pulsed laser deposition process (PLD-248 nm krF excimer laser), a bottom electrode 11 La(Sr, Co)O$_3$ (LSCO) is formed on MgO(100), SrTiO single crystalline substrate. Then, as shown in FIGS. 2b and 2c, the incident laser is applied to the target being rotated, so that the film is deposited. At this time, two targets are simultaneously installed to deposit a BTO layer 12 and STO layer 13 having predetermined thickness T1 and T2, respectively. The rotating speed of the target is 10 rpm. In addition, the deposition temperature is set about 650° C. with raising the deposition temperature by 10° C. per minute and the partial pressure of oxygen maintained at 100 mTorr. The deposition speed of the BTO layer and STO layer is 11 pulse/1 unit lattice and 13 pulse/1 unit lattice, respectively. The laser is incident into the target in a rate of 1 pulse/second.

According to the present invention, the period of the BTO/STO artificial lattice is varied to $BTO_1$ unit lattice/$STO_1$ unit lattice (simply referred to $BTO_1/STO_1$, 1 unit lattice≈0.4 nm), $BTO_2/STO_2$, $BTO_5/STO_5$, $BTO_{12}STO_{12}$, $BTO_{25}/STO_{25}$, and $BTO_{63}/STO_{63}$, and the total thickness (T1+T2) is fixed to 100 nm. That is, $BTO_1/STO_1$ means that the BTO and STO are repeatedly deposited in a thickness about 0.4 nm. Here, the period is obtained by adding a unit lattice of BTO to a unit lattice of STO, which means a lattice constant of a new artificial lattice, which does not exist in nature. Accordingly, if the film is deposited in a thickness of 100 nm, the BTO and STO are respectively deposited in 125 times. Thus, 250 layers are formed. Therefore, in case of $BTO_{125}/STO_{125}$, two BTO layer and STO layer are formed, and each layer thereof is obtained by depositing 125 times.

After depositing the BTO and STO artificial lattices, the temperature in the vacuum chamber is lowered to a room temperature by decreasing the temperature by 10° C. per minute. At this time, the partial pressure of oxygen in the chamber is maintained at 400 Torr.

The above mentioned deposition thickness and the total thickness does not limit the scope of the present invention. As shown in FIG. 2D, a platinum film is formed on the insulation film as a top electrode 14, so that a metal-insulator-metal structure is manufactured. In addition, a device having a metal-insulator structure or insulator-metal structure can be formed on the substrate.

Figure 3:
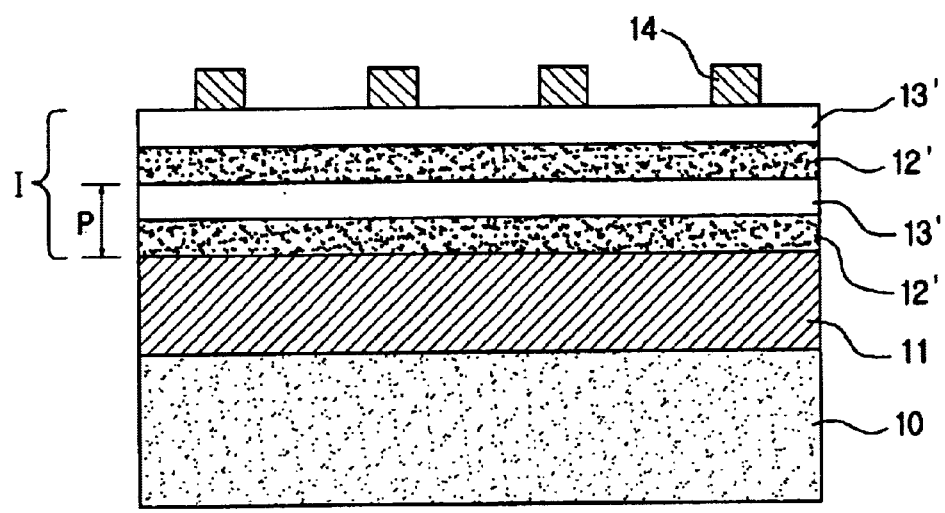
FIG. 3 is a sectional view of a dielectric device having the artificial lattice formed through a plurality of deposition processes.

FIG. 3 is a cross sectional view showing a device formed with the artificial lattice through a plurality of deposition processes. Referring to FIG. 3, the bottom electrode 11, BTO and STO (12' and 13'), which are repeatedly deposited at least two times, and the top electrode 14 are sequentially deposited on the MgO substrate 10. At this time, the BTO and STO (12' and 13') forms one artificial lattice 1, which is obtained by periodically and repeatedly depositing the BTO and STO (12' and 13'). The dielectric material is any one selected from the group consisting of $BaTiO_3$, $SrTiO_3$, $KNbO_3$, $KTaO_3$, $PbTiO_3$, $PbZrO_3$, and $CaTiO_3$ having a peroveskite structure. Instead of the peroveskite structure, a dielectric material having other structure can be used. That is, any structure, such as tungsten bronze and pyroclore structures, capable of regularly stacking periods of various atoms can be used. In addition, a repeat period P is formed due to the periodic deposition.

In the present embodiment, the repeat deposition is carried out by using BTO and STO having dielectric constant different from each other. However, the high dielectric constant and tunability targeted in the present invention can be obtained by depositing one of BTO and STO. In addition, the artificial lattice formed by combining various dielectric materials can be adapted for various semiconductor and telecommunication devices.

When comparing the artificial lattice formed through the above process with the conventional (Ba, Sr)TiO₃, the difference thereof will be easily understood.

Figure 4:
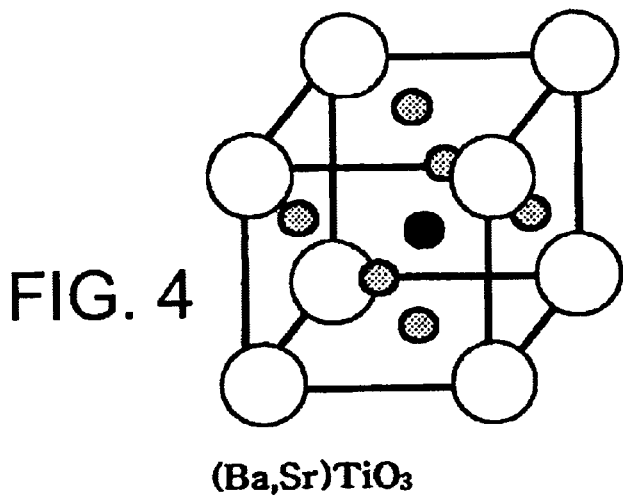
FIG. 4 is a view showing a lattice structure of (Ba, Sr)$TiO_3$.
Figure 5:
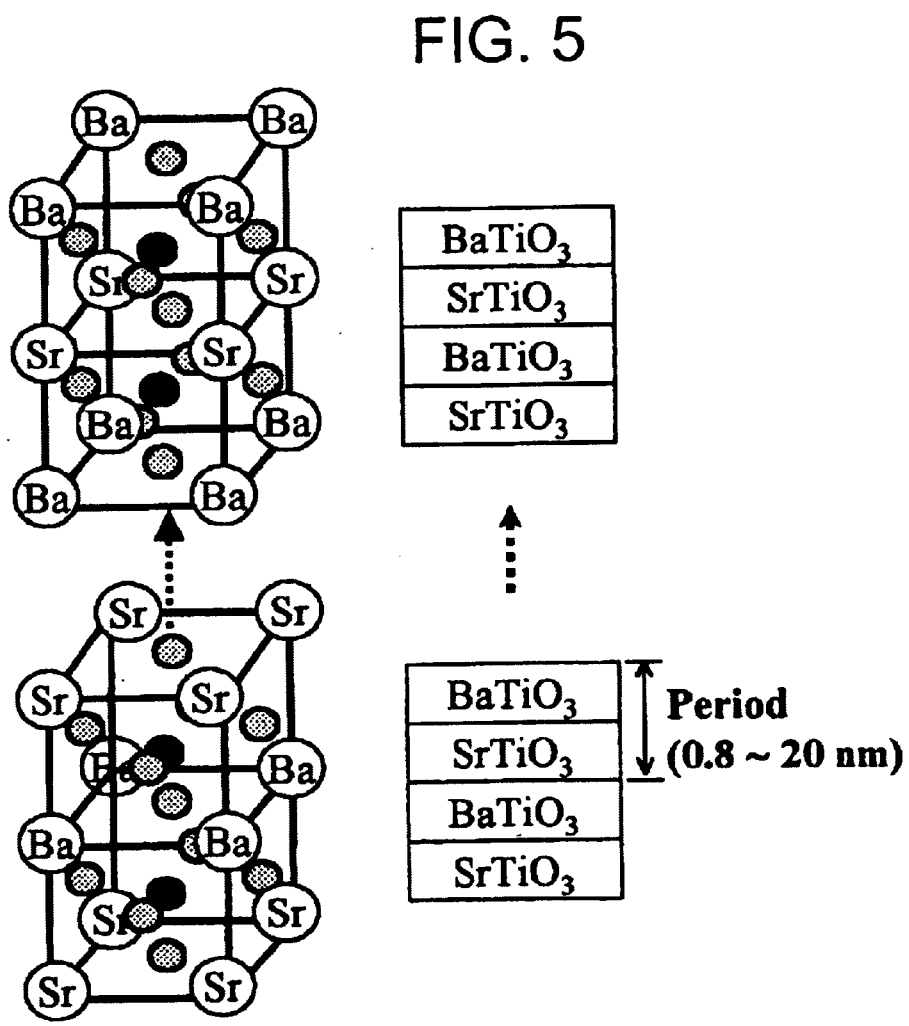
FIG. 5 is a view showing a structure of the artificial lattice of $BaTiO_3/SrTiO_3$ according to one embodiment of the present invention.

FIG. 4 is a lattice structure of (Ba, Sr)TiO₃ and FIG. 5 is a structure of the artificial lattice of $BaTiO_3/SrTiO_3$. As shown in FIGS. 4 and 5, when comparing the structural characteristic of (Ba, Sr)TiO₃ with the artificial lattice of $BaTiO_3/SrTiO_3$, the artificial lattice of $BaTiO_3/SrTiO_3$ according to the present invention has a layer-by-layer structure where Ba atoms and Sr atoms are regularly aligned at a peak. However, in the general (Ba, Sr)TiO₃ structure, Ba atoms and Sr atoms are irregularly aligned at the peak.

Hereinafter, the single atomic layer and unit lattice layer of the present invention will be described.

Firstly, in order to discriminate the single atomic layer from the unit lattice layer, the $BaTiO_3$ peroveskite structure used in the present invention will be described as an example. In a cubic structure, Ba, and Ti are respectively positioned at edges and a center of the cubic structure. In addition, O is positioned at middle portions of six surfaces forming the cubic structure. The above structure is repeated so that a solid crystal is formed. That is, the repeated cubic structures are defined as a basic unit of the solid crystal, called "unit cell". Accordingly, unit lattice thickness is a length of one side of the cubic, and the unit lattice layer is one layer of the cubic structure. In addition, one surface of the cubic structure only consists of Ba and O, thereby forming the single atomic layer. Therefore, the unit lattice layer is formed through stacking the single atomic layers, and solid material is formed through stacking the unit lattice layers. The present invention can perform the process with adopting the single atomic layer thickness or unit lattice layer thickness.

In order to inspect the crystal structure of the artificial lattice deposited with multi-layer films, an X-ray diffractometry (XRD) having Cu—Ka wavelength ($\lambda$=1.5405 Å) is used. In addition, the composition distribution according to a depth of the artificial lattice is analyzed by means of an Auger electron spectroscopy (AES). A high resolution transmission electron microscope (HRTEM) is used for analyzing the interdiffusion between BTO and STO layers of the artificial lattice. In addition, the electrical characteristic is measured by using an LCR analyzer (HP4194A Impedance Analyzer).

Figure 6:
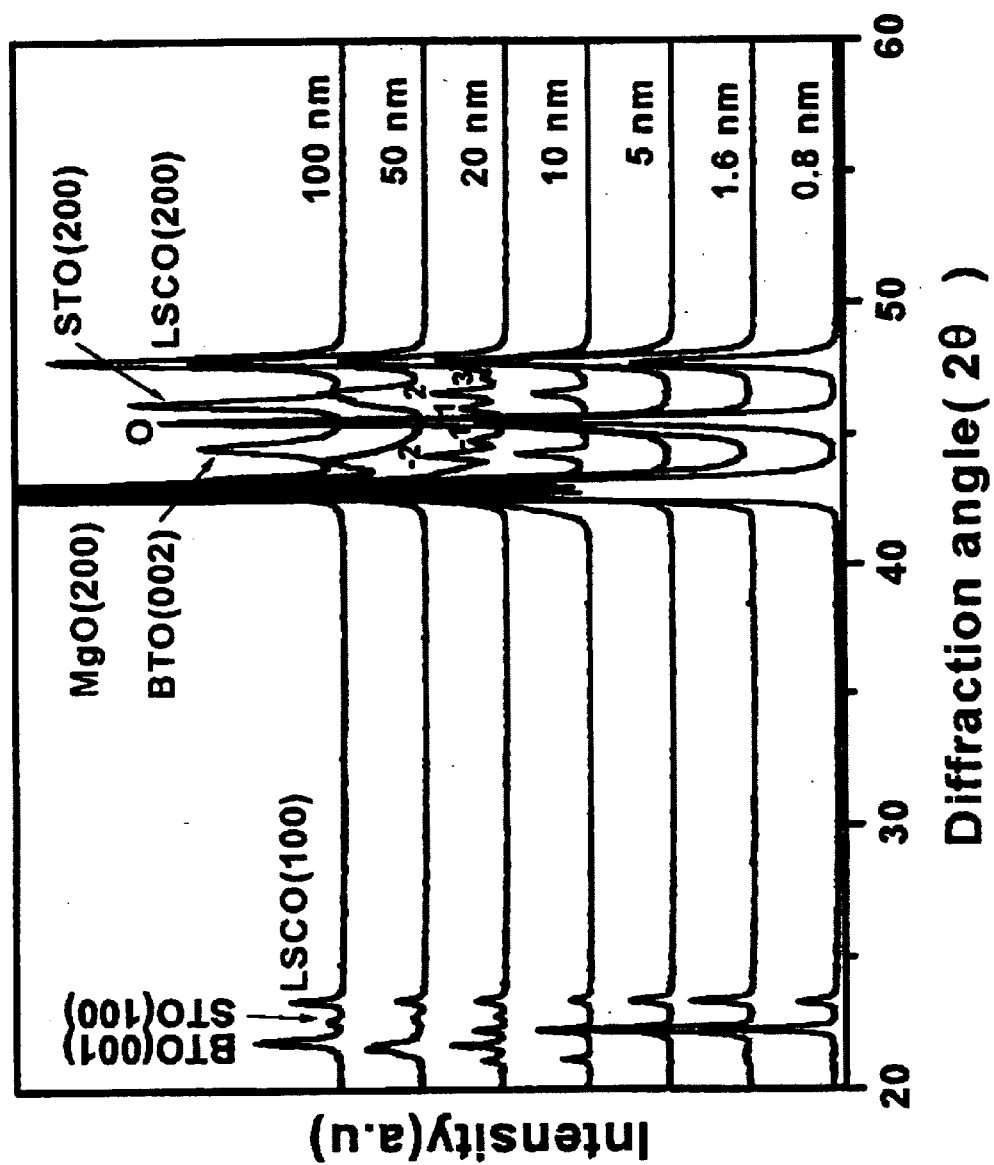
FIG. 6 is a graph showing an XRD pattern result according to the variation of the periodicity of the BTO/STO artificial lattice deposited on LSCO/MgO substrate.

FIG. 6 is a graph showing an XRD pattern result according to the variation of the periodicity of the BTO/STO artificial lattice deposited on LSCO/MgO substrate. Referring to FIG. 6, the BTO/STO artificial lattice is deposited with a total thickness of 100 nm by varying the periodicity of the BTO/STO artificial lattice to $BTO_1/STO_1$, $BTO_2/STO_2$, $BTO_5/STO_5$, $BTO_{12}/STO_{12}$, $BTO_{25}/STO_{25}$, and $BTO_{63}/STO_{63}$ under the same process condition. Here, a transverse direction of the graph is a diffraction angle (2θ) between X-ray incident into a sample and X-ray scattered by making contact with crystal of a film of the BTO/STO artificial lattice and a longitudinal direction of the graph is an intensity of the scattered X-ray.

As is understood from the graph, peaks shown at angles of 43 and 48 degrees represent the directional features of the MgO(200) substrate and lower electrode LSCO(200), respectively. In addition, each BTO/STO artificial lattice film is deposited and grown in the direction identical to the direction of the MgO substrate. The peak shown at an angle of 45.7 degree is a main peak representing a mean face-to-face distance between BTO and STO layers. Satellite peaks representing the characteristic of the artificial lattice are shown at both sides of the main peak. In samples above $BTO_{25}/STO_{25}$, where a periodicity exceeds a critical thickness, the stress between the BTO and STO layers is increased, so the coherence cannot be maintained at the interfacial surface between the BTO and STO layer so that the main peak is disappeared. In a sample of $BTO_{63}/STO_{63}$, the diffraction peak of each BTO and STO layer is represented. In samples of $BTO_1/STO_1$, $BTO_2/STO_2$, $BTO_5/STO_5$, and $BTO_{12}/STO_{12}$, where the coherence is maintained at the interfacial surface of the BTO/STO artificial lattice films, the diffraction angle is lowered as the deposition thickness thereof becomes increased, which means that the mean interplanar distance of the BTO/STO artificial lattice is increased. The distortion of $BTO_1/STO_1$, $BTO_2/STO_2$, $BTO_5/STO_5$, and $BTO_{12}/STO_{12}$ artificial lattices, which have the deposition thickness below the critical thickness so as to maintain the coherence at the interfacial surface of the BTO and STO layers, caused by the stress is influenced by the compliance value of each BTO and STO layer. The compliance value (S=3.15×10⁻¹² m²/N) of the BTO layer is larger than the compliance value (S=0.74×10⁻¹² m²/N) of the STO layer, so the BTO artificial lattice is more distorted than the STO artificial lattice. In addition, the interplanar distance is increasing as the deposition thickness becomes increased.

The diffraction pattern of the BTO/STO artificial lattice film is grown on the MgO single crystalline substrate in the c-axis direction, and satellite peaks representing the characteristic of the artificial lattice are detected. In the artificial lattice having a period of 10 nm, two separate diffraction peaks of BTO and STO layers are shown. The satellite peaks of the BTO/STO artificial lattices having periods of 10 and 4 nm are overlapped with peaks diffracted from the MgO substrate and LSCO electrode. It is understood from the simulation result with regard to the X-ray diffraction of the BTO/STO artificial lattices that the satellite peak of the artificial lattice having a low period of 1.6 and 0.8 nm is not detected due to the low diffraction thereof. If the period of the BTO/STO artificial lattice is sufficiently lowered, the artificial lattice will be transformed by the non-coherence between the BTO/STO layers. As the period increases, the stress caused by the non-coherence of the lattice may generate the incoherent dislocation at the interfacial surface of the BTO and STO layers. The critical thickness causing the incoherent dislocation can be calculated from a model suggested by Matthews. In case of the BTO/STO artificial lattice having the incoherency of 2.5%, the critical thickness is about 20 nm. Therefore, if the period exceeds 20 nm, the coherence cannot be maintained at the interfacial surface between the BTO/STO layers, so the XRD diffraction main peak of the artificial lattice having the period of 20 nm is disappeared as shown in FIG. 6. In addition, the main peak of the artificial lattice gradually moves to a direction of high diffraction angle as the period is reduced within the critical thickness. It means that the mean interplanar distance of the lattice constant of BTO and STO is reduced at the period becomes reduced. The distortion of each layer within the critical thickness is affected by the mechanical stress reciprocally generated between layers. Accordingly, since the mean interplanar distance is reduced as the period becomes decreased, the BTO lattice is more distorted than the STO lattice in the artificial lattice.

Figure 7:
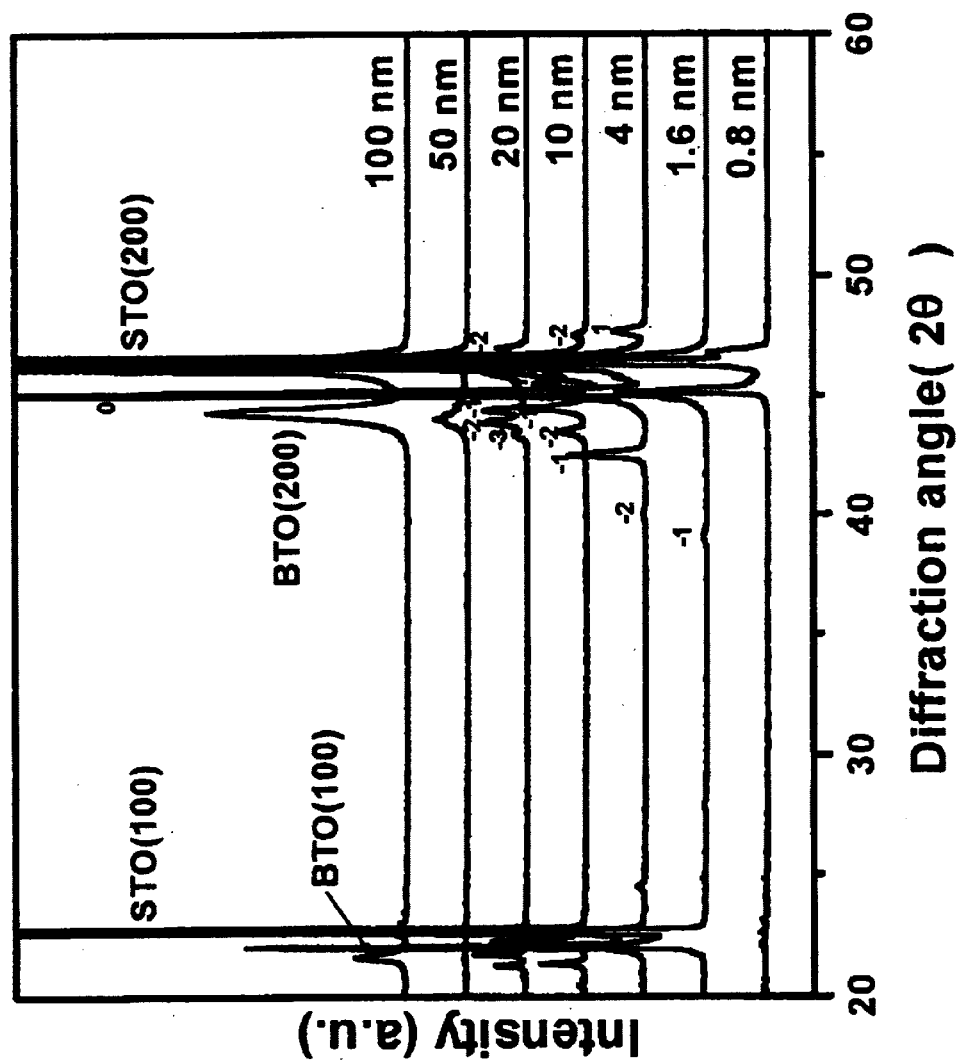
FIG. 7 is a graph showing an XRD pattern result according to the variation of the periodicity of the BTO/STO artificial lattice deposited on $SrTiO_3$(100) substrate.

FIG. 7 is a graph showing an XRD pattern result according to the variation of the periodicity of the BTO/STO artificial lattice deposited on SrTiO$_3$(100) substrate. Referring to FIG. 7, the structure of artificial lattice deposited on the STO substrate is similar to the structure of artificial lattice deposited on the MgO substrate and the crystalline property of the film is inferior in the temperature below 630° C. Therefore, it is required to deposit the BTO/STO artificial lattice on LSCO/MgO substrate in the temperature above 630° C., so as to form a required artificial lattice.

Figure 8:
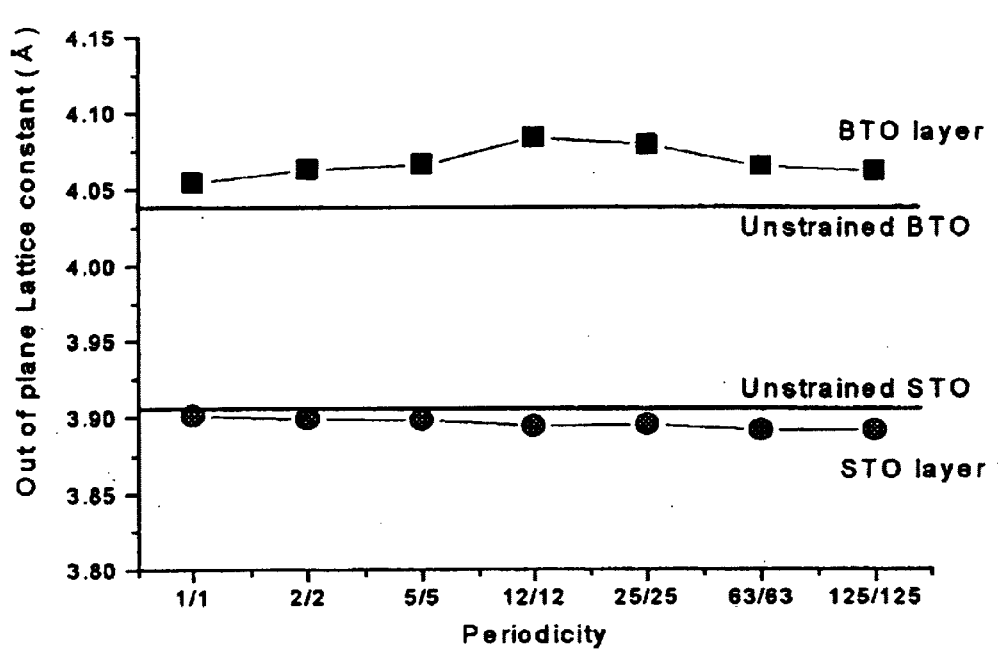
FIG. 8 is a graph showing the lattice constant in the out-of-plane (c-axis) direction according to the variation of the periodicity of the BTO/STO artificial lattice.
Figure 9:
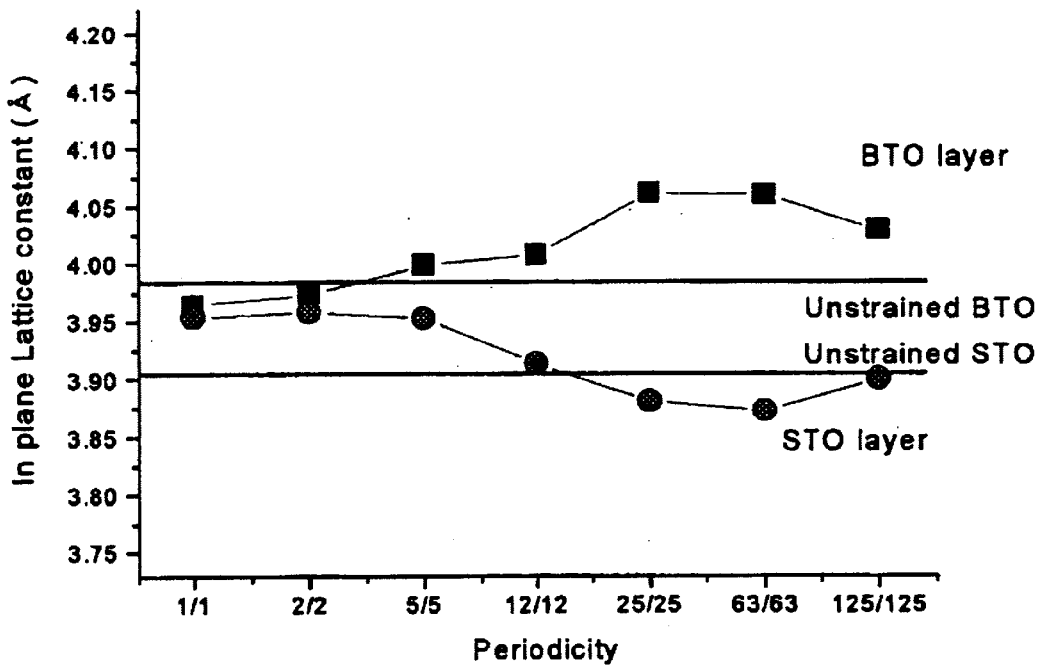
FIG. 9 is a graph showing the lattice constant in the in-plane (a-axis) direction according to the variation of the periodicity of the BTO/STO artificial lattice.
Figure 10:
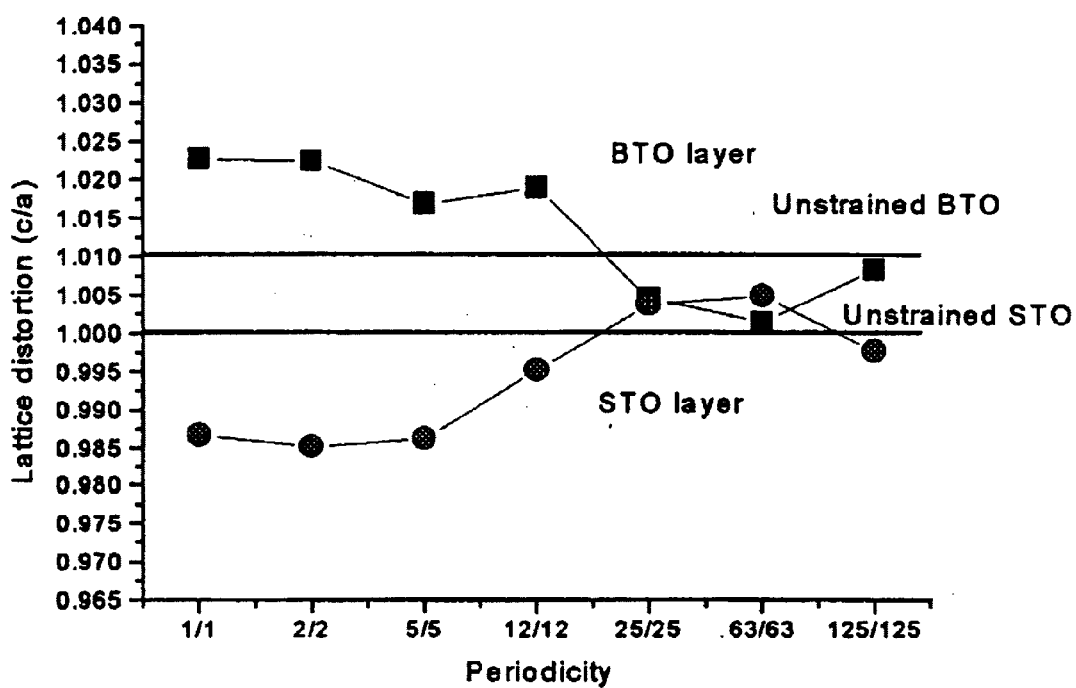
FIG. 10 is a graph showing the tilt of the lattice (c/a ratio) according to the variation of the periodicity of the BTO/STO artificial lattice deposited on an LSCO/MgO single crystalline substrate.

FIG. 8 is a graph showing the lattice constant in the out-of-plane (c-axis) direction according to the variation of the periodicity of the BTO/STO artificial lattice, and FIG. 9 is a graph showing the lattice constant in the in-plane (a-axis) direction according to the variation of the periodicity of the BTO/STO artificial lattice. FIG. 10 is a graph showing the distortion of the lattice (c/a ratio) according to the variation of the periodicity of the BTO/STO artificial lattice deposited on an LSCO/MgO single crystalline substrate.

Referring to FIGS. 8 to 10, the BTO and STO layers of the BTO/STO artificial lattice formed on the substrate are distorted due to the reciprocal mechanical pressing action generated therebetween. The distortion ratio (c/a ratio) is measured by obtaining the lattice constant in the out of plane (c-axis) direction and in plane (a-axis) direction. Firstly, the lattice constant in the c-axis direction is obtained by using the interplanar distance in the XRD structure shown in FIG. 6. In the 50 and 100 nm periods, the interplanar distance is obtained from the peaks of BTO and STO. In addition, in the periods below 50 and 100 nm, the lattice constant with respect to low periods is obtained by using the main peak and the interplanar distance (d) of (001) surface of LSCO.

By considering the elastic coefficient of the BTO and STO, the lattice constant of each layer, that is d$_{BTO}$ and d$_{STO}$ are obtained. The result is shown in the table below.

|  | 0.8 nm | 1.6 nm | 4 nm | 10 nm | 20 nm |
| --- | --- | --- | --- | --- | --- |
| STO | 3.90116 | 3.89914 | 3.89837 | 3.89429 | 3.89536 |
| BTO | 4.05434 | 4.06296 | 4.06623 | 4.08339 | 4.07904 |

In the thickness below the critical thickness, the lattice constant of the BTO is reduced as the period becomes reduced. On the contrary, the lattice constant of the STO is relatively stable. It can be understood from the table that the BTO layer is more distorted than the STO layer.

The lattice constant of the in-plane is calculated in an asymmetric mode. The result is shown in FIG. 9.

Below the critical thickness (20 nm), the lattice constant of the BTO is reduced as the period becomes reduced. In the period below 10 nm, the compressive stress is applied to the BTO layer. On the contrary, the lattice constant of the STO is increased as the period becomes reduced, and in the period below 10 nm, the tensile stress is applied to the STO layer. In FIG. 10, the result of the c/a ratio, that is, the lattice distortion is shown which is obtained by using the lattice constant of the c-axis and a-axis with respect to the BTO and STO layers. Below the critical thickness (20 nm), the distortion of the BTO is increased as the period becomes decreased. On the contrary, the lattice distortion of the STO is reduced as the period becomes decreased. According to the analyzing result, the lattice distortion of BTO and STO layers is extremely presented at a period of 1.6 nm.

Figure 11:
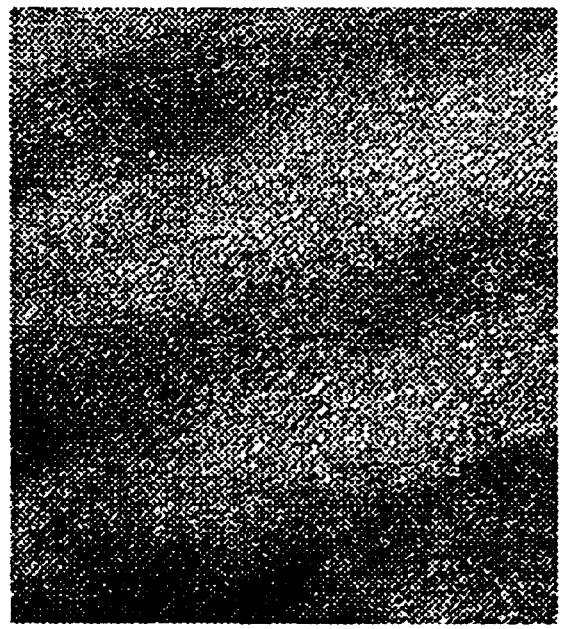
FIGS. 11 to 13 are views showing HRTEM image of the BTO/STO artificial lattice at each periodic stage thereof.
Figure 12:
Figure 13:
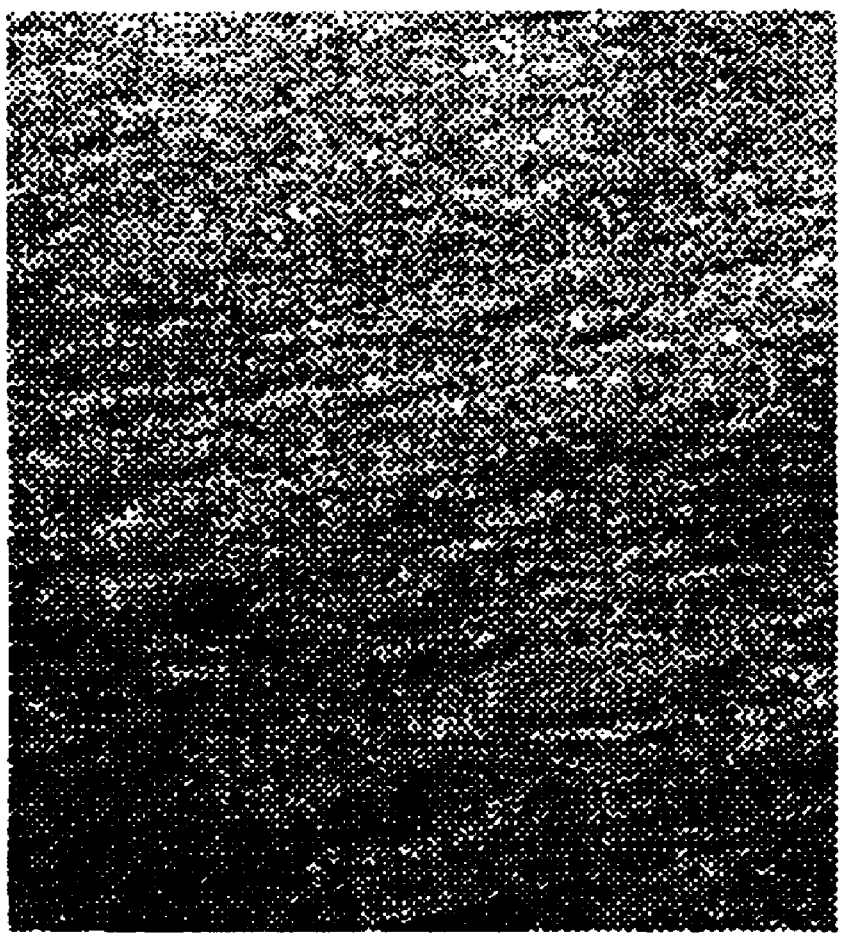

FIG. 11 is a view showing an HRTEM image of the BTO/STO artificial lattice having a period of 10 nm, FIG. 12 is a view showing an HRTEM image of the BTO/STO artificial lattice having a period of 4 nm, and FIG. 13 is a view showing an HRTEM image of the BTO/STO artificial lattice having a period of 1.6 nm. As shown in the figures, the BTO/STO artificial lattice film is deposited and grown in the direction identical to the direction of an MgO substrate. The BTO/STO artificial lattice film is periodically grown without interdiffussion between the BTO and STO layers. In order to analyze the structure of the BTO/STO artificial lattice, X-ray diffraction method and the HRTEM are used. As a result, the BTO/STO artificial lattice deposited through the pulsed laser deposition process is deposited and grown in the direction identical to the direction of the MgO substrate without creating dispersion between the BTO and STO layers, thereby forming the multi-layer artificial oxide lattice. FIGS. 11 to 13 show the result of HRTEM image of the BTO/STO artificial lattices having periods of 10 nm, 4 nm, and 1.6 nm, respectively. In the HRTEM image having the period of 4 nm, one layer has a thickness of 21 Å, which is matched with the period characteristic of the present invention. Referring to FIG. 12, the BTO/STO artificial lattice is well grown without interdiffusion even in a low period. Therefore, with reference to the XRD result, in the structure of the BTO/STO artificial lattice deposited through the PLD process, the artificial lattice is well grown periodically.

Figure 14:
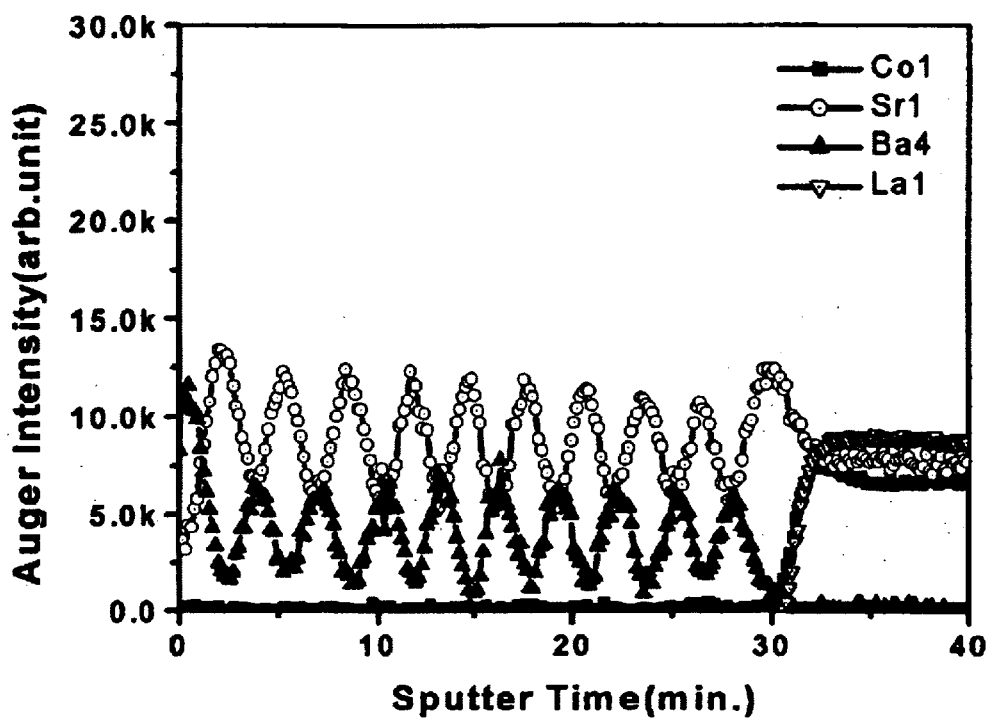
FIG. 14 is a graph showing an AES depth profile result with respect to 10 nm period of the BTO/STO artificial lattice.

FIG. 14 is a graph showing an AES analyzing result with respect to 10 nm period of the BTO/STO artificial lattice. At this time, the composition according to the depth profile of the BTO/STO artificial lattice deposited on the LSCO/MgO substrate through the PLD method is analyzed by using the AES. PHI AES4300 model is used as an analyzing device, and the composition analysis regarding to the depth profile of the BTO/STO artificial lattice is carried out by using Ar ion gun. The composition analyzing result with respect to 10 nm period of the BTO/STO artificial lattice is shown in FIG. 14. As shown in FIG. 14, a regular oscillation is detected over the multi-layer film together with the periodicity of 10 nm. This means that the interdiffusion is not occurred at the interfacial surface between the BTO film layer and the STO film layer while the multi-layer film is being deposited.

Figure 15:
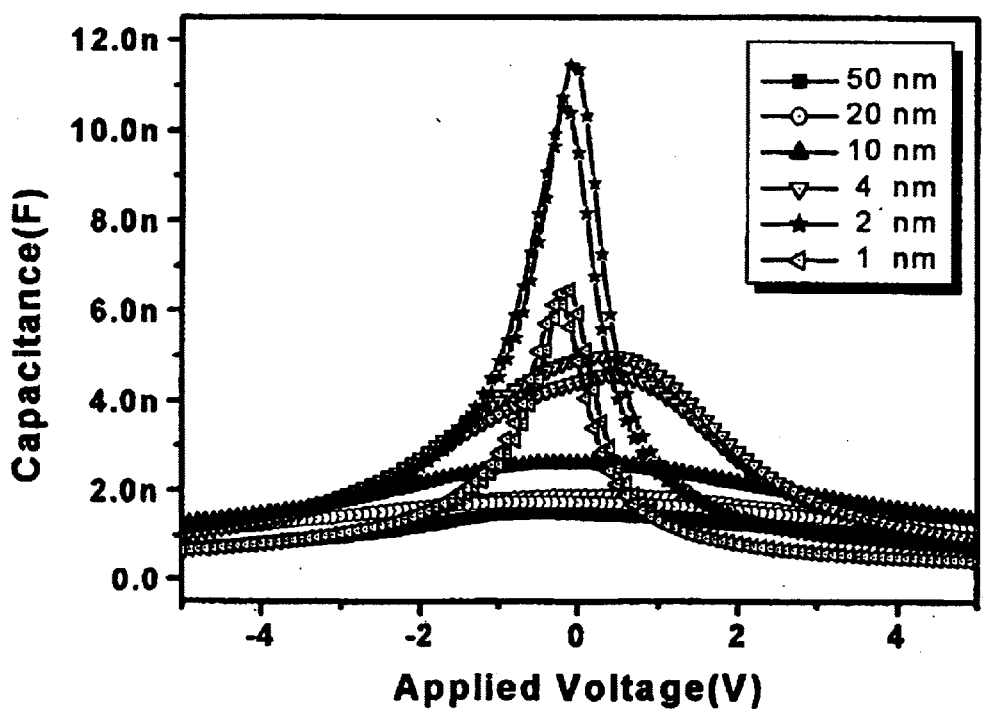
FIG. 15 is a graph showing a C-V characteristic according to the variation of the periodicity of the BTO/STO artificial lattice deposited on LSCO/MgO substrate.
Figure 16:
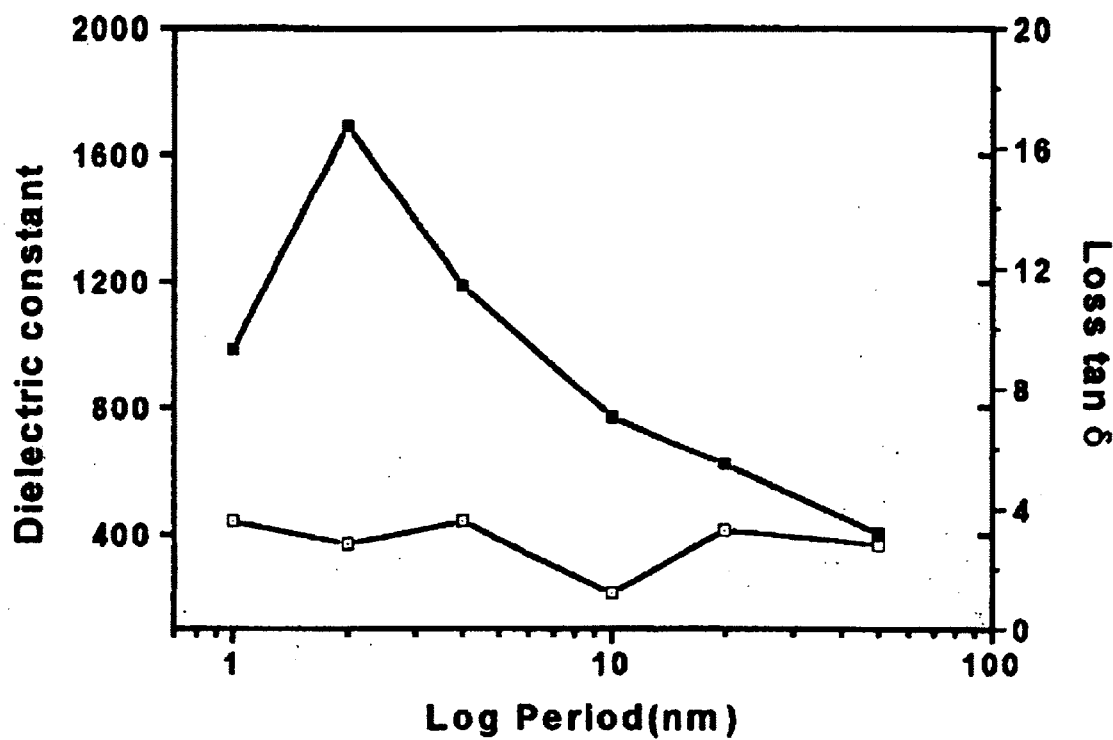
FIG. 16 is a graph showing a dielectric constant and a dielectric loss according to the variation of the periodicity of the BTO/STO artificial lattice deposited on LSCO/MgO substrate.

FIG. 15 is a graph showing a C-V characteristic according to the variation of the periodicity of the BTO/STO artificial lattice deposited on LSCO/MgO substrate, and FIG. 16 is a graph showing a dielectric constant and a dielectric loss according to the variation of the deposition thickness of the BTO/STO artificial lattice deposited on LSCO/MgO substrate. Referring to FIGS. 15 and 16, a top Pt electrode is deposited on a sample of the LSCO-BTO/STO artificial lattice-LSCO deposited on the MgO substrate by a thickness of 10 nm through a sputtering process. Then, the sample is wet-etched in a solution, which is obtained by adding 1% of nitric acid to ionic water, for 10 seconds. Then, capacitance-voltage (C-V) characteristic is measured by using LCR analyzer (HP4194A Impedance analyzer). The frequency is obtained by sweeping the voltage from −5 V to +5 V and vice versa at 1 MHz. The C-V result is shown in FIG. 15. As shown in FIG. 15, different characteristic is periodically represented. That is, the capacitance value becomes reduced as the period is reduced, and the highest capacitance value is presented at a period of 1.6 nm. The high capacitance value with respect to the applied voltage allows the artificial lattice to be preferably adapted for the tunable microwave device. The result of the dielectric constant and the dielectric loss of the BTO/STO artificial lattice is shown in FIG. 16. Referring to FIG. 16, the dielectric constant becomes increased as the period of the artificial lattice is reduced. The dielectric constant is peaked at a period of 1.6 nm to 1700 and 2–3% of the dielectric loss is generally represented. Since the dielectric constant is highest at the period of 1.6 nm, the BTO and STO layers are respectively subject to the compressive stress and tensile stress in the in-plane direction at the period of 1.6 nm. The stress is related to the high dielectric constant. In a high period above 20 nm, the stress is relaxed, so incoherent dislocation is created at the interfacial surface, thereby reducing the dielectric constant.

Figure 17:
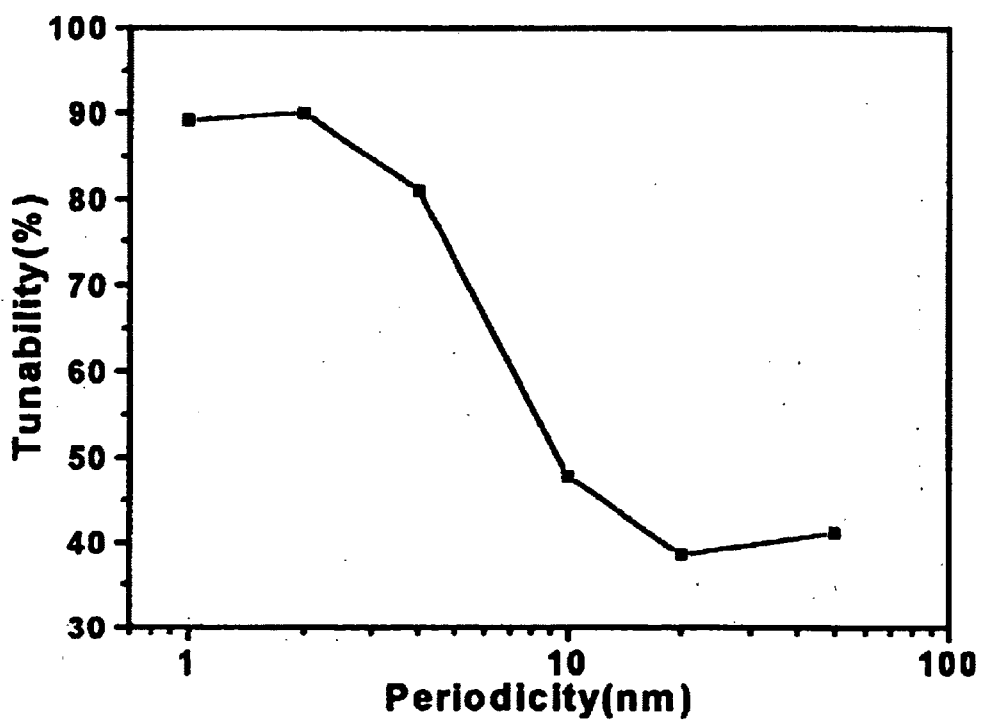
FIG. 17 is a graph showing the tunability according to the variation of the periodicity of the BTO/STO artificial lattice.

FIG. 17 is a graph showing the tunability ($=(C_{max}-C_{min})/C_{min}$) according to the variation of the periodicity of the BTO/STO artificial lattice in $BTO_1/STO_1$, $BTO_2/STO_2$, $BTO_5/STO_5$, $BTO_{12}/STO_{12}$, $BTO_{25}/STO_{25}$, and $BTO_{63}/STO_{63}$. Referring to FIG. 17, when the deposition thickness of the BTO/STO artificial lattice is above $BTO_{12}/STO_{12}$, the tunability is lowered and the lowest tunability (32%) is represented at the $BTO_{25}/STO_{25}$ artificial lattice. The reason is that the coherence cannot be maintained at the interfacial surface between the BTO and STO layers when the deposition thickness of the BTO/STO exceeds the critical thickness (20 nm), so the stress is relieved at the interfacial surface. When the periodicity is below the critical thickness, such as $BTO_1/STO_1$, $BTO_2/STO_2$, $BTO/STO_5$, and $BTO_{12}/STO_{12}$, the tunability characteristic is increased. The highest tunability (=94%) is represented at the deposition thickness of $BTO_2/STO_2$. The structure of the artificial lattice having the deposition thickness of $BTO_2/STO_2$ includes Ba and Sr atoms, which are regularly aligned at edges of a regular hexahedron. The tunability of 94% in an electric field of 0.5 MV/Cm is higher than the tunability of any conventional insulation films. Accordingly, the characteristic of the microwave voltage tunable device can be improved if the high tunability is adapted for the microwave voltage tunable device.

Figure 18:
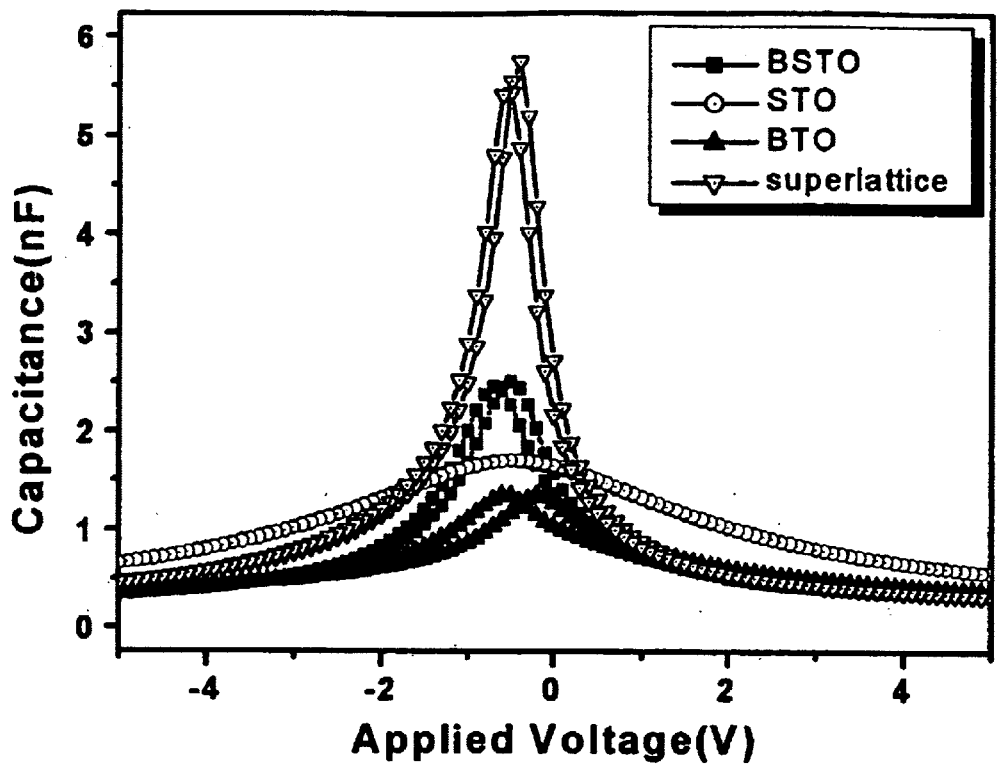
FIG. 18 is a graph showing the C-V characteristic of the BTO/STO artificial lattice, BTO, STO and BST thin film materials.

FIG. 18 is a graph showing the C-V characteristic of the BTO/STO artificial lattice, BTO, STO and BST (barium strontium titanate) materials. Here, the tunability represents the dependency of dielectric feature according to the voltage applied based on the C-V curve and is defined as $(C_{max}-C_{min})/C_{min}$. FIG. 17 shows the tunability characteristic result according to the variation of the periodicity of the BTO/STO artificial lattice deposited on MgO/LSCO substrate. The period becomes reduced and the tunability is increased at the periodicity below the critical thickness (20 nm). According to the test, the highest tunability of 94% is represented at the period of 1.6 nm. The tunability value is higher than the tunability of convention BST films. Factors allowing the high tunability are not yet clear up. The effect of the stress may cause high tunability. According to the test, the lattice tilt (c/a ratio) of the BTO layer is highest at the period of 1.6 nm. On the contrary, the lattice tilt (c/a ratio) of the STO layer is lowest at the period of 1.6 nm. Accordingly, the lattice deformation of the STO and BTO layers is pointed as the reason for the high tunability.

Figure 19:
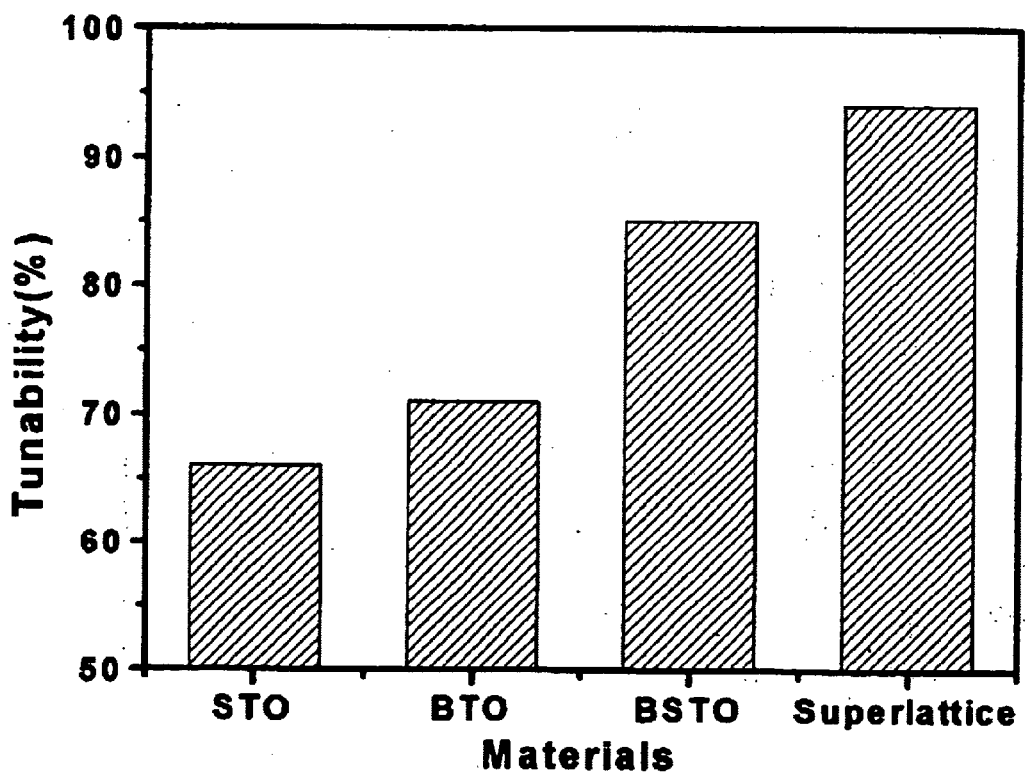
FIG. 19 is a graph showing the tunability property of the BTO/STO artificial lattice, BTO, STO AND BST thin film materials.

FIG. 19 is a graph showing the tunability characteristic of the artificial lattice, BTO, STO and BST materials. AS shown in FIG. 19, the artificial lattice represents the highest C value. The result of the tunability is shown in FIG. 19. The tunability is also highest at the artificial lattice having a period of 1.6 nm. The tunability becomes higher in the order of STOP BTO and BST. The tunability of the artificial lattice is higher than the tnability of a general solid solution material. However, the reason thereof is not yet clear up. As mentioned above, the stress generated at the interfacial surface between the BTO and STO layers may cause the high tunability of the artificial lattice. The degree of the lattice distortion may be strongly related to the tunability.

As mentioned above, the BTO/STO oxide artificial lattice is deposited on MgO(100), $SrTiO_3$ single substrate through the pulsed laser deposition process. An LSCO oxide electrode is formed on the MgO substrate as a buffer layer for the epitaxial of the artificial lattice. In order to check the epitaxial and crystalline feature of the BTO/STO artificial lattice, the XRD is measured. In addition, in order to analyze the composition of the artificial lattice in a depth direction thereof, the HRTEM and AES analysis are carried out. As a result, the BTO/STO artificial lattice is epitaxially grown in accordance with the design rule without creating the inter-diffusion between the BTO and STO layers. In order to analyze the lattice distortion of the epitaxially grown BTO and STO layers, the lattice constant in the out-of-plane (c-axis) and in-plane (a-axis) directions is calculated. In addition, the distortion ratio of the lattice in each BTO layer and STO layer is analyzed by obtaining the c/a ratio. The electrical characteristic, such as the dielectric constant, dielectric loss, and the tunability, is detected. The features of the dielectric constant and the tunability are similar to each other with respect to the variation of the periodicity. That is, below the critical thickness (20 nm), the dielectric constant and the tunability are increased as the period becomes reduced. The highest dielectric constant (1700) and the highest tunability (94%) are represented at a period of 1.6 nm. The above features of the BTO/STO artificial lattice are superior to the features of BST, BTO, and STO single film solid solution material. However, the reason thereof is not yet clear up. The lattice distortion of the BTO and STO, which is caused by the reciprocal mechanical pressing therebetween, is anticipated as the reason. In the period of 1.6 nm, the c/a of the BTO is 1.03334, that is, the lattice of the BTO is increased in the c-axis direction. On the contrary, the c/a of the STO is 0.97708, that is, the lattice of the STO is increased in the a-axis direction. Therefore, it is understood that the BTO is subject to the compressive pressure and the STO is subject to the tensile stress at the interfacial surface thereof. Accordingly, the stress generated in the STO and BTO layers and the lattice distortion caused by the stress are strongly related to the dielectric constant and the tunability. In addition, as a function device of the tunable microwave device, the BST, and STO have been suggested and studied. However, since the BTO/STO artificial lattice has the superior features as a new advanced material which does not exist in nature, it can be contributed to the functional device of the tunable microwave device.

As described above, the dielectric device having a multi-layer oxide artificial lattice and a method for manufacturing the same according to the present invention can provide the BTO/STO artificial lattice insulation film having a specific structure, which does not exist in nature. The artificial lattice insulation film has the tunability and dielectric constant higher than those of the conventional insulation film. In addition, even when the thickness is reduced, the dielectric constant thereof is constantly maintained, so is the higher voltage tunability. Since the size of the dielectric device can be reduced due to its high dielectric constant, the dielectric material used in the microwave voltage tunable devices, memory or MOS devices can be replaced with the dielectric device of the present invention with improving the characteristic of the device. In case of tunability, the conventional $SrTiO_3$ or $(Ba, Sr)TiO_3$ represents the tunability of 75% with respect to an electric field of 1 MV/cm, which is a maximum value so far reported. However, the artificial lattice having the deposition thickness of $BTiO_3/STO_3$ represents the extremely high tunability of 94% with respect to the electric field of 0.5 MV/cm. Accordingly, by utilizing the above features, if the conventional insulation film of the microwave voltage tunable devices, memory or MOS devices is replaced with the artificial lattice film according to the present invention, the size of the device can be reduced due to the high tunability and the high dielectric constant thereof. In addition, it is possible to drive the device by applying a low driving voltage without deteriorating the functional effect of the device and the efficiency of the device can be improved.

According to the present invention, though the whole thickness of the artificial lattice becomes shallow, dielectric constant of the oxide artificial lattice is highly maintained. Based on the above physical properties, the artificial lattice can be adapted for a capacitor of a very large integrated DRAM, or a gate oxide layer of an MOS device.

In addition, the non-linearity of the dielectric constant can be remarkably improved, so a high level non-linearity, which cannot be obtained through the convention method fabricating material existing in nature, can be obtained. Thus, the artificial lattice can be adapted for the dielectric member of the voltage tunable microwave devices (which are also called as frequency agile devices).

In detail, at the semiconductor memory and CMOS in highly integrated above tera level, the required dielectrics become nano-scaled, so stuff having high dielectric constant is required for overcoming the quantum effect or the tunneling effect. However, the conventional stuff having high dielectric constant is ferroelectrics, so the dielectric constant is decreased as the thickness thereof becomes shallow. On the contrary, the oxide artificial lattice maintains the high dielectric constant though the thickness thereof becomes more shallow, the oxide artificial lattice can be adapted for the very large integrated semiconductor device (memory and MOS device).

In addition, in dielectrics used in a microwave wireless telecommunication device, if dielectric constant is varied depending on the voltage applied thereto (nonlinear property), new or advanced functions superior to the conventional telecommunication device can be obtained. For example, an antenna, which is mechanically operated, can be electronically operated fast by adjusting the voltage. In addition, it is possible to achieve a telecommunication device capable of varying the pass band of a band filter through adjusting the voltage. At this time, it is very important for the dielectrics to enlarge the voltage tunability, so as to achieve the above functions with a low voltage level. Since the artificial lattice according to the present invention has high dielectric constant, the size of the device becomes compact. In addition, according to the present invention, the wireless telecommunication device can be operated with a low voltage due to the high voltage tunability and the pass band of the filter can be enlarged, so the amount of information to be transmitted in the wireless telecommunication device can be increased.

While the present invention has been described in detail with reference to the preferred embodiments thereof, it should be understood to those skilled in the art that various changes, substitutions and alterations can be made hereto without departing from the scope of the invention as defined by the appended claims.

What is claimed is:

1. A dielectric device comprising:
   a multi-layer oxide artificial lattice, said artificial lattice including
      a stacked structure including a plurality of dielectrics, and
         wherein said plurality of dielectrics includes at least two different layers in a predetermined order, thereby forming a supercell crystal layer which is repeatedly stacked, resulting in one artificial lattice having an identical direction feature, and wherein the dielectric material of the plurality of dielectrics includes $BaTiO_3$ and $SrTiO_3$ having a peroveskite structure.

2. The dielectric device of claim 1, wherein said plurality of dielectrics has a unit lattice including stacked single atomic layers in which at least two different unit lattice layers are stacked in a predetermined order, thereby forming one artificial lattice having an identical direction feature.

3. The dielectric device as claimed in claim 1, comprising a substrate, the multi-layer oxide artificial lattice layered on the substrate,
   wherein the substrate and the plurality of dielectrics forming the stacked structure have crystal structures having either 1) directional features identical to each other, or 2) a finite degree of tilting angle between the multi-layer oxide artificial lattice and substrate by inserting an intermediate layer between the multi-layer oxide artificial lattice and the substrate.

4. The dielectric device as claimed in claim 1, wherein the artificial lattice includes a capacitor of memory devices.

5. A microwave comprising a capacitor of which a dielectric constant is varied according to a voltage and includes the dielectric device as claimed in claim 1.

6. An rf tunable device comprising a capacitor of which a dielectric constant is varied according to a voltage and includes the dielectric device as claimed in claim 1.

7. A gate oxide layer of a MOS device comprising the dielectric device as claimed in claim 1.

8. The dielectric device of claim 1, wherein each of said plurality of dielectrics has a single-layer atomic thickness.

9. A dielectric device comprising:

a multi-layer oxide artificial lattice, said artificial lattice including a stacked structure including a plurality of dielectric layers having a composition including $BaTiO_3$ and $SrTiO_3$ having a peroveskite structure, wherein said plurality of dielectric layers includes at least two single atomic layers in a predetermined order in a first direction, thereby forming one artificial lattice having an identical direction feature in the first direction, wherein two adjacent dielectric layers of the plurality of dielectric layers forming the one artificial lattice are epitaxially arranged, and wherein a planar spacing between the two adjacent dielectric layers is about a unit cell in thickness.

10. The dielectric device of claim 9, wherein the two single atomic layers have a different unit lattice length in the first direction.

* * * * *